United States Patent [19]

Bayruns et al.

[11] Patent Number: 5,428,837
[45] Date of Patent: Jun. 27, 1995

[54] METHOD AND APPARATUS FOR REDUCING LOCAL OSCILLATOR LEAKAGE IN INTEGRATED CIRCUIT RECEIVERS

[75] Inventors: Robert J. Bayruns, Middlesex, N.J.; Scott D. Sweeney, Quakertown, Pa.; Osvaldo J. Lopez, North Bergen, N.J.

[73] Assignee: Anadigics, Inc., Warren, N.J.

[21] Appl. No.: 3,897

[22] Filed: Jan. 13, 1993

[51] Int. Cl.⁶ .................. H04B 1/10; H04B 15/06
[52] U.S. Cl. ........................ 455/317; 455/318; 455/333
[58] Field of Search ........... 455/296, 298, 299, 310, 455/313, 317, 318, 319, 333, 323; 331/117 FE, 117 R; 307/443, 542, 542.1, 572

[56] References Cited

U.S. PATENT DOCUMENTS

| | | | |
|---|---|---|---|
| 3,626,302 | 9/1969 | Nakamura | 325/436 |
| 4,355,420 | 10/1982 | Ishihara | 455/317 |
| 4,662,001 | 4/1987 | Cruz et al. | 455/340 |
| 4,759,078 | 7/1988 | Schiller | 455/49 |
| 4,791,521 | 12/1988 | Ouyang et al. | 307/542 |
| 4,811,425 | 3/1989 | Feerst | 455/316 |
| 4,890,301 | 12/1989 | Bo Hedberg | 375/60 |
| 4,918,706 | 4/1990 | Phillips et al. | 375/1 |
| 4,952,822 | 8/1990 | Dikken | 307/443 |
| 4,982,120 | 1/1991 | Longwell et al. | 307/443 |
| 5,001,724 | 3/1991 | Birgenbeier et al. | 375/10 |
| 5,001,773 | 3/1991 | White | 455/118 |
| 5,086,512 | 2/1992 | Bartz | 455/186 |

FOREIGN PATENT DOCUMENTS

| | | | |
|---|---|---|---|
| 0004317 | 1/1985 | Japan | 455/333 |
| 0105914 | 5/1986 | Japan | 455/333 |
| 0128506 | 5/1990 | Japan | 455/333 |
| 01245608 | 5/1990 | Japan | 455/317 |
| 2218591 | 5/1988 | United Kingdom . | |

Primary Examiner—Reinhard J. Eisenzopf
Assistant Examiner—Nguyen Vo
Attorney, Agent, or Firm—Pennie & Edmonds

[57] ABSTRACT

Technique for reducing local oscillator leakage in integrated frequency conversion circuits is disclosed, which provides coupling an external portion of a resonator circuit to the integrated frequency conversion circuit. The coupling is accomplished without using any of the DC power or ground pins of the conversion circuit. A frequency conversion circuit based on this technique includes resonator, oscillator, and mixer circuits. Part of the oscillator and mixer circuit is encapsulated in a package, whereas at least a portion of the resonator circuit is located outside the package. The outside portion of the resonator circuit connects to at least two external resonator pins of the package such that, during the operating of the conversion circuit, the net current entering the package via said external resonator pins is approximately zero.

9 Claims, 6 Drawing Sheets

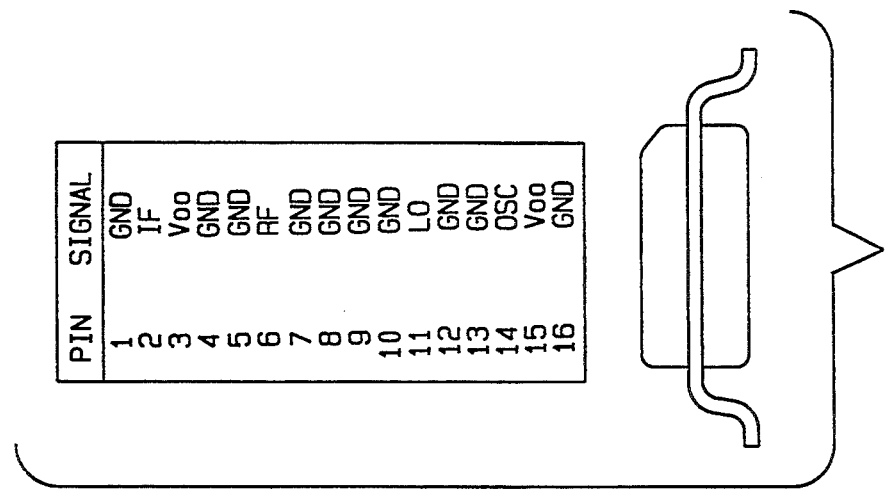
FIG. 2C
Prior Art
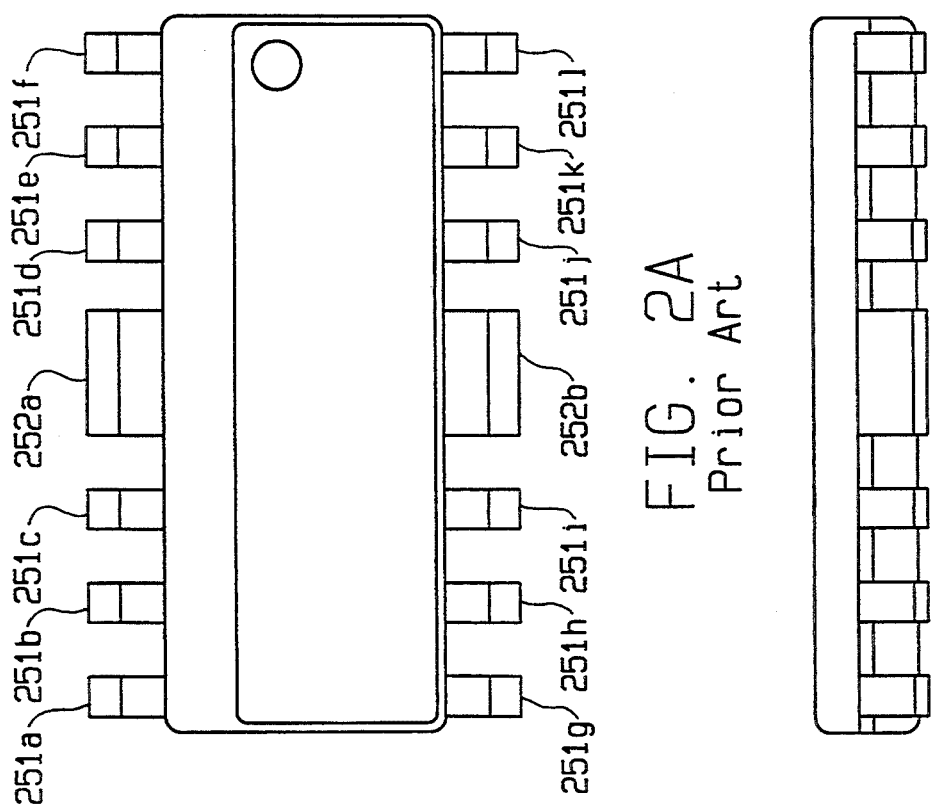
FIG. 2A
Prior Art
FIG. 2B
Prior Art

METHOD AND APPARATUS FOR REDUCING LOCAL OSCILLATOR LEAKAGE IN INTEGRATED CIRCUIT RECEIVERS

FIELD OF THE INVENTION

The present invention relates generally to the field of high frequency, integrated frequency conversion circuits and, more particularly, to a novel technique for reducing local oscillator leakage in such circuits.

BACKGROUND OF THE INVENTION

Local oscillator (LO) leakage is a well known and common problem in radio frequency (RF) receiver circuits. Ideally, a receiver should not transmit, or "leak", any energy at the LO frequency. However, higher frequency receivers employ correspondingly higher LO frequencies, at which it becomes very difficult to design and costly to manufacture receivers with acceptably low LO leakage.

Excessive LO leakage causes significant problems in many modern communications systems. One familiar example derives from the field of automotive radar detectors. Upon initial market introduction, low cost radar detectors proved quite effective in warning motorists of nearby transmissions from law enforcement officials. However, as the popularity of the inexpensive radar detectors rose, users experienced a pronounced increase in the frequency of false alarms. These false alarms, it turned out, were being triggered by the excessive LO leakage from other low cost automotive radar detectors. The eventual solution involved the introduction of more sophisticated and costly units which proved capable of discriminating between the LO leakage from motorists' detectors and the radar transmissions from law enforcement officials.

Generally speaking, however, such discrimination and elimination of LO leakage interference is not feasible since the frequency of the leaking LO signal can be exactly the same as that of the signal of interest. This is, for example, the reason why use of commercial FM broadcast receivers is typically prohibited on commercial airline flights. Under certain circumstances, the LO signal frequency from a commercial FM receiver may correspond identically to the air-to-ground communications frequency, thus posing a threat to the pilot's communications. The problem stems, in large part, from the high levels of LO leakage associated with most inexpensive, hand-held FM receivers.

LO frequencies are selected, at least in part, to mitigate potential interference with existing communications bands. In situations where the LO frequencies of a particular class of receivers fall within a known communications band, regulation of the maximum allowable LO leakage from such receivers is prudent. The Federal Communications Commission (FCC) routinely promulgates such regulations. For example, the maximum power that receivers may radiate in the 1-2 GHz range in the United States is −45 dBm.

LO leakage is particularly troublesome for receivers or frequency conversion circuits in which the LO band overlaps the RF input band. One obvious reason is that the overlap in LO and RF input frequencies may cause LO interference among densely spaced, similar type receivers. A more subtle reason derives from the fact that it is inherently more difficult to reduce LO leakage in a receiver or frequency conversion circuit in which the RF input and LO frequencies are relatively close. To appreciate this point, one must consider the typical causes of LO leakage.

FIG. 1 depicts the overall structure of the front end of a receiver or other frequency conversion device. RF amplifier 11 amplifies the RF input signal from antenna or cable input 10. Mixer 13 combines the amplified input signal 12 with the LO signal 14 generated by LO 16 to produce IF output signal 15. At high frequencies, the LO leakage of the simple mixer 13 is often undesirably high, due in large part to the parasitic capacitance of the devices available to implement mixer 13. Thus, node 12 often maintains a substantial signal at the LO frequency. To reduce the LO signal at the antenna input node 10, and thus the overall LO leakage, one must design RF input amplifier 11 to have a very low reverse gain at the LO frequency. More precisely, it is the ratio of the forward gain of RF amplifier 11 at the RF input frequency to the reverse gain of the same amplifier at the LO frequency which most strongly affects LO leakage.

Unfortunately, designing RF amplifier 11 to meet these specifications is neither easy nor cheap. First, as the frequency of the system increases, parasitic capacitances reduce the achievable ratio of forward to reverse gain in amplifier 11. To address this problem, RF amplifier 11 can be made frequency selective. For example, U.S. Pat. No. 4,662,001 shows a system that uses a frequency selective RF input amplifier. In this system, interstage tuned coupling circuit 24 (see FIG. 1 of the '001 patent) implements a tunable notch filter, designed to track the LO frequency and reduce the LO leakage in the system. Other known techniques employ phase cancellation of the LO signal at the input terminal; i.e., an appropriately phase shifted and scaled version of LO signal 14 is applied to RF input terminal 10 in order to compensate for, or "cancel", the LO leakage signal at input terminal 10. See, for example, U.S. Pat. Nos. 4,811,425 and 5,001,773. With most such phase cancellation techniques, the improvement attainable is at best an order of magnitude and more typically about a factor of two. Moreover, the hardware needed to implement the canceling feedback is non trivial.

Thus, there remains a significant need for a method and apparatus for reducing LO leakage in high frequency circuits.

There also exists a present need for a method and apparatus for reducing LO leakage in integrated receiver circuits.

Still further, there exists a need for a method and apparatus for reducing the effects of parasitic inductances in high frequency analog integrated circuits.

Yet another present need relates to a method and apparatus for reducing the LO leakage in integrated frequency conversion circuits caused by the parasitic inductances of integrated circuit packages.

A similar present need involves a method and apparatus for reducing LO leakage caused by the parasitic package inductances in thick film or other modularly encapsulated frequency conversion circuits or devices.

Still another need involves the reduction of inductive feedback or coupling through the power and/or ground terminals of encapsulated or integrated circuits and, in particular, a method and apparatus for reducing such coupling.

These and other objectives are satisfied, at least in part, by the present invention as set forth in broad terms immediately below, and further by means of a detailed description of the presently preferred embodiment.

SUMMARY OF THE INVENTION

The present invention provides a method and apparatus for reducing LO leakage in integrated or otherwise encapsulated frequency conversion circuits. The invention stems, in part, from the recognition and discovery that a substantial source of LO leakage in such circuits emanates from the feedback caused by the unavoidable parasitic inductances associated with the pins of circuit encapsulating packages. At very high frequencies, recognizing this source of LO leakage and mitigating its effects in accordance with the teachings of this invention is key, since the magnitude of this inductive feedback increases with frequency and since this source of LO leakage cannot be effectively reduced using the previously described RF amplifier design, filtering or phase cancellation techniques.

Due to the limitations of integrated circuit fabrication technology, integrated receivers typically employ an off-chip reactive element (variable or fixed) as part of the LO resonator. Familiar examples of such off-chip reactive elements used to form the off-chip resonator portion include fixed and variable capacitors, inductors, varactors, crystal resonators, or any combination of these. One or more pins of the circuit encapsulating package connect the off-chip resonator portion (which can be viewed as including the series inductance of the pins) with an on-chip resonator portion to complete the resonator circuit. Even though the resonator consumes little power, substantial transient currents flow between the capacitive and inductive portions of the resonator as the resonator voltage oscillates. These transient currents, as they pass through the pins connecting the on-chip and off-chip portions of the resonator, induce transient voltages across the series parasitic inductances of these pins.

One aspect of the present invention provides an improved structure and method for coupling the off-chip and on-chip portions of the resonator circuit such that the transient voltages induced by parasitic pin inductances do not lead to increased LO leakage. This aspect of the invention is premised, in part, on the recognition of precisely how these resonator transient currents cause significant LO leakage in conventional integrated circuit receivers.

Conventional integrated circuit receiver designs typically strive to conserve use of limited package pins and, to this end, attempt to minimize the number of pins used to connect the off-chip and on-chip portions of the resonator. Many oscillator topologies, including the popular Clapp variant of the Colpitts topology, afford a single pin connection between the on-chip and off-chip resonator portions. In such topologies, the system ground provides the connection which closes the loop between the off-chip and on-chip portions of the resonator—i.e., one terminal of the on-chip portion is connected to the on-chip system ground and one terminal of the off-chip portion is connected to the off-chip system ground. Thus, in effect, these conventional topologies use the chip's ground pin for two purposes: (1) to provide a DC reference for the chip; and (2) to complete the loop which connects the off-chip and on-chip portions of the resonator.

Unfortunately, as recognized by the inventors, this dual use of the chip ground pin (or pins) substantially increases the overall LO leakage. The transient currents flowing through the chip ground pins induce an oscillation, at the LO frequency, in the on-chip ground voltage which produces disturbances throughout the chip. Importantly, the presence of the LO frequency noise modulating the ground voltage couples a significant LO frequency noise component into the RF input amplifier, which directly affects the level of LO leakage from the input terminal of the RF amplifier.

The invention provides a method and apparatus which greatly reduce the level of LO noise in the on-chip ground voltage of integrated circuit receivers and the LO leakage which, the inventors have recognized, results from this LO frequency ground noise. This reduction in LO noise and leakage is achieved by providing an alternative path, other than via the ground (or DC power) terminal, through which the resonator transient currents flow between the off-chip and on-chip portions of the resonator circuit. By directing the transient resonator currents away from the chip's ground terminal(s), the invention avoids the previously described resonator-induced ground noise, and the increased LO leakage which results therefrom.

Topologically, integrated frequency conversion circuits constructed in accordance with the present invention use at least two pins to couple between the off-chip and on-chip portions of the resonator circuit. When only two pins are used, one pin carries a current flowing from the on-chip to the off-chip resonator portion while the other pin carries an equal current returning from the off-chip to the on-chip resonator portion. Even as the transient current in the resonator oscillates, the currents through these pins cancel and the net current leaving the package through these "resonator coupling pins" remains approximately zero. Since no net current is leaving the package via these resonator coupling pins, there is no need for other pins, particularly the ground or DC power pins, to carry compensating transient currents to balance any net current leaving the package via the resonator coupling pins. Thus, transient currents flowing through other package pins are reduced.

Of course, the invention is in no way limited to the use of only two resonator coupling pins. Any number of resonator coupling pins may be used. As long as each resonator coupling pin is floating—i.e., not also used to couple DC power or ground to the chip—the advantages of the invention will be realized. Embodiments of the invention employing more than two resonator coupling pins still maintain the property that the net current leaving the chip package via the resonator coupling pins is approximately zero, or, alternatively stated, the total transient current leaving the package via some of the resonator coupling pins is equal to the total transient current entering the package via the remaining resonator coupling pins.

The invention can also be viewed in terms of the summation and cancellation of the out-of-phase transient currents which flow in the inductive and capacitive legs of the parallel resonator circuit, respectively in a typical integrated frequency conversion circuit, the phase of the current in the capacitive (on-chip) resonator portion is $+90°$ while that in the inductive (off-chip) portion is $-90°$. The invention provides an on-chip summing point, which can be a part of the overall on-chip ground or power metalization, at which these out-of-phase currents cancel, thereby avoiding substantial disruption of the overall on-chip ground or power voltage.

BRIEF DESCRIPTION OF THE DRAWINGS

The various features and advantages of the invention will be better appreciated in light of the detailed description of the preferred embodiment, which is to be read in conjunction with the following drawings, in which:

FIGS. 2A through 2C are drawings of three views of a package used to encapsulate the preferred embodiment of the invention;

DETAILED DESCRIPTION OF THE PREFERRED EMBODIMENT

Reference is made to FIGS. 2A–C, which depict three views of an exemplary dual inline package used to encapsulate the preferred embodiment of the invention. Package 200 comprises a body 250, which encapsulates the on-chip circuitry, and a plurality of surface mount pins 251a–l and 252a–b, which couple signals between off-chip circuitry and on-chip circuitry. In package 250, batwing pins 252a–b couple the power and ground signals from the board to the on-chip circuitry. While batwing pins 252a–b do afford somewhat lower parasitic resistance and inductance and enhanced thermal dissipation, and thus represent a part of the best mode known to the inventors for practicing the present invention, they are by no means required to realize the advantages of the invention.

A problem with integrated circuit packages generally, illustrated with reference to package 200, is the undesirable parasitic capacitances between adjacent pins and the series inductances of the individual pins. In package 200, each pin, for example 251c, will see a parasitic capacitance to each of its neighboring pins, 251b and 252a in the example. At high frequencies, these parasitic coupling capacitances couple signals between adjacent pins, which can represent a source of LO leakage. With proper assignment of pins, however, this source of LO leakage can be largely mitigated. This is accomplished, for example, by assigning the RF input to a pin adjacent to pins which carry DC or low frequency signals, as opposed to those which carry high frequency signals such as the resonator coupling pins. Often, duplicate DC power and ground pins are used to enhance capacitive isolation of critical pins.

The series parasitic inductances of pins 251a–l and 252a–b, or the pins of any known package, present a greater challenge to the circuit designer. At frequencies of 1–2 GHz, the pins impose a series impedance on the order of 1 Ohm—i.e., large enough that coupling of signals in this frequency range via transient currents in the pins which supply DC power or ground to the chip is a substantial problem. The inventors recognized that such coupling in integrated circuit receivers represents a significant source of LO leakage.

Figure 1:
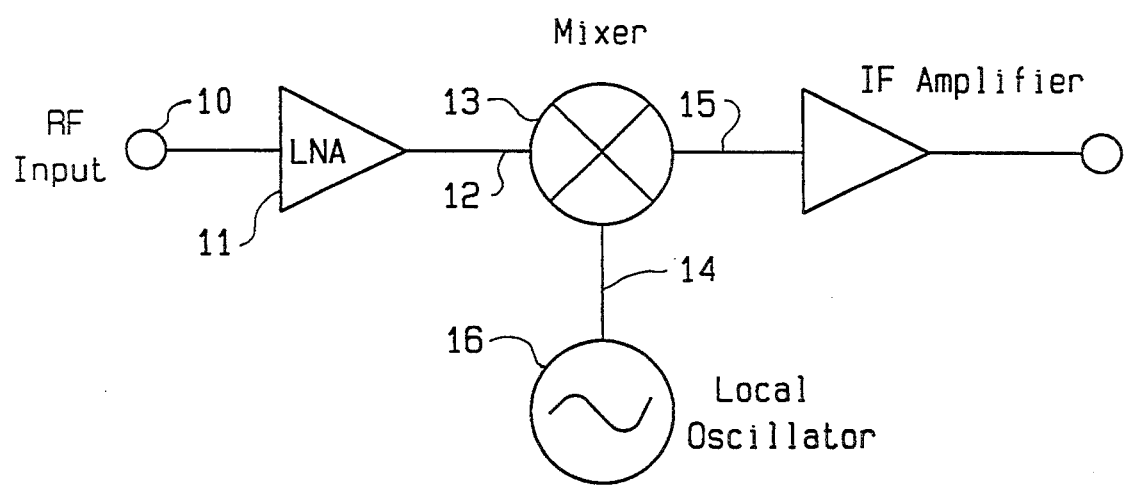
FIG. 1 is a block diagram of a typical prior art receiver circuit.
Figure 3:
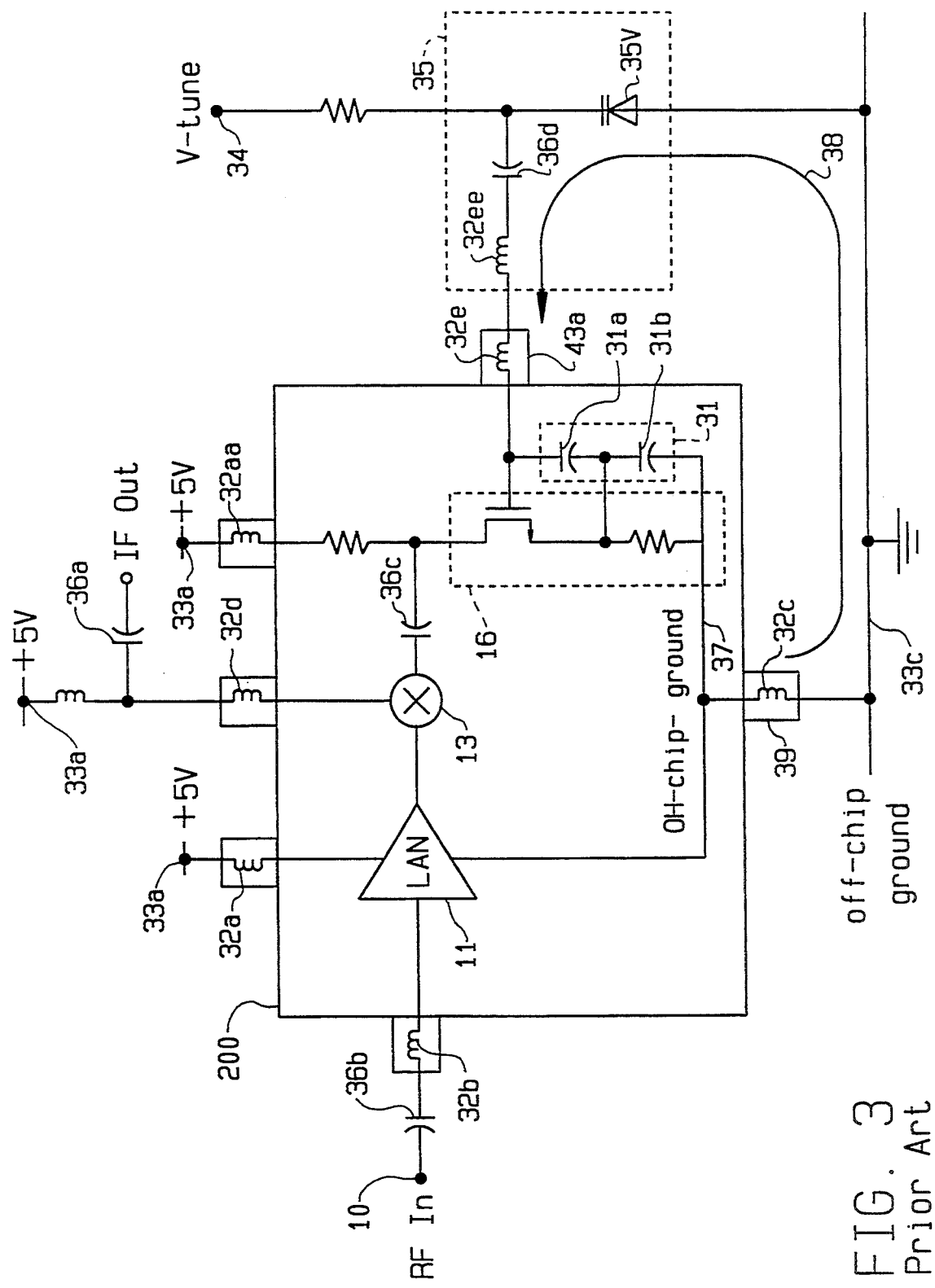
FIG. 3 is an abstracted schematic diagram of an integrated circuit receiver showing the conventional method for coupling off-chip and on-chip resonator portions.
Figure 4:
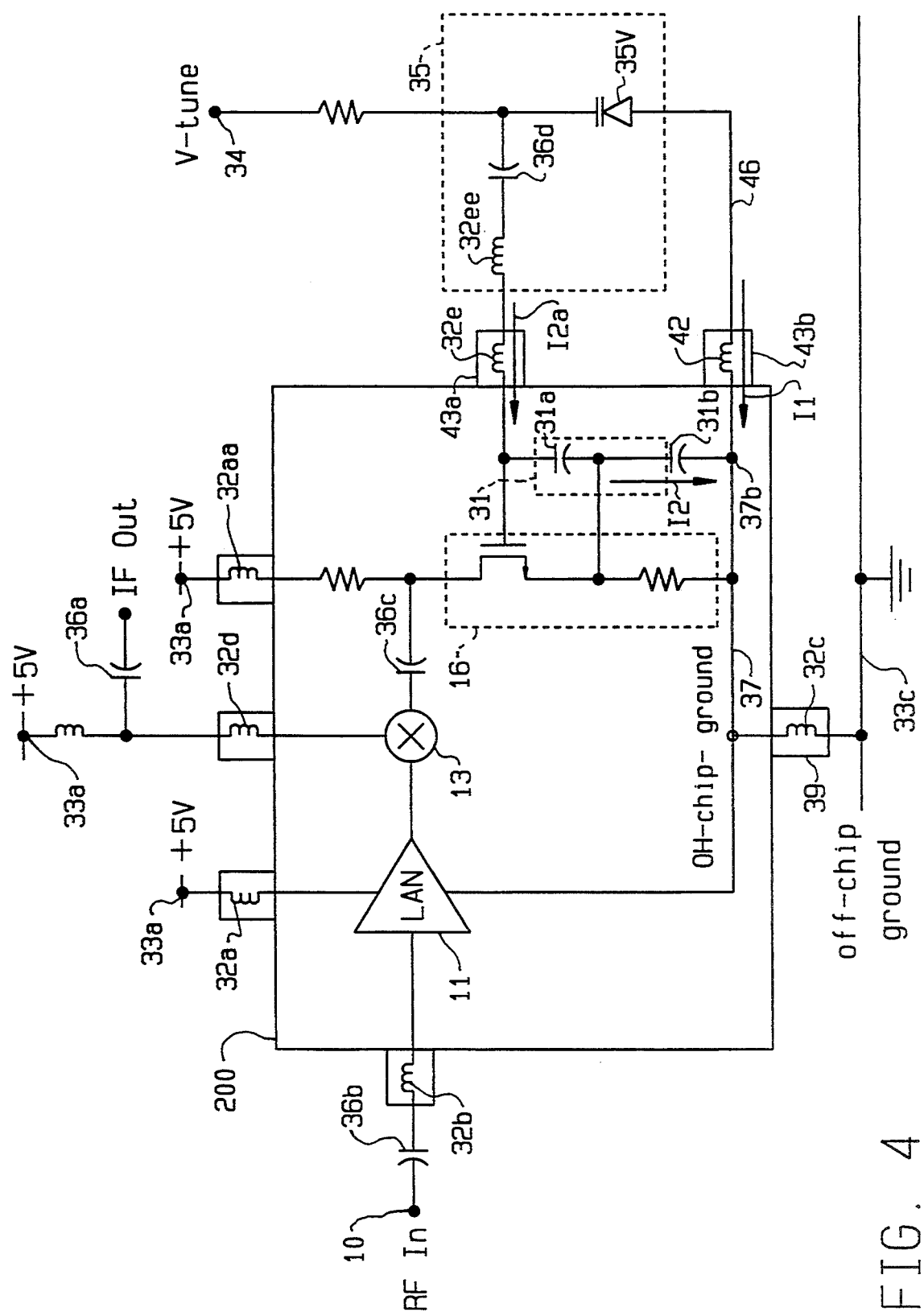
FIG. 4 is an abstracted schematic diagram of an integrated circuit receiver showing the method for coupling off-chip and on-chip resonator portions in accordance with the present invention.

In both FIGS. 3 and 4, the chip 200 is an ADC20010, a GaAs Direct Broadcast Satellite Tuner IC available, for example, from ANADIGICS, INC., Warren, N.J. The off-chip varactor 35v is a Toshiba 1SV186. However, as will be appreciated by those skilled in the art, the invention may be practiced using a variety of commercially available or custom manufactured parts.

To better understand this coupling problem, reference is now made to FIG. 3, which depicts an integrated circuit receiver utilizing the conventional method for coupling off-chip and on-chip resonator portions. Package 200 encapsulates RF input amplifier 11, mixer 13, local oscillator 16 and an on-chip resonator portion 31. Various signals are coupled to/from the encapsulated circuits via a plurality of pins, each represented by a series parasitic inductance: 5 Volt DC power 33a via inductors 32a and 32aa; RF input 10 via inductor 32b; off-chip system ground 33c via inductor 32c; and, IF output 15 via inductor 32d. The coupling between on-chip resonator portion 31 and off-chip resonator portion 35 utilizes inductor 32e, which represents the inductance of the package pin. The off-chip resonator portion 35 includes an effective inductor 32ee, which represents the net lumped inductance of any off-chip inductive elements such as wires, discrete inductors and the series lead inductance of the varactor 35v. The receiver of FIG. 3 also includes a plurality of DC blocking capacitors, 36a–d, each of which serves the conventional DC isolation function.

The receiver of FIG. 3 employs a varactor 35v as a tuning element, the capacitance of which varies with the DC tuning voltage 34. Of course, a variety of off-chip tuning elements—such as mechanically tuned capacitive and inductive elements, fixed capacitive and inductive elements, other variable inductive elements, crystal-based tuning circuits or any combination of these—could alternatively be used, and the invention is in no way limited to varactor tuned circuits. In off-chip resonator portion 35, the capacitance of varactor 35v subtracts from and reduces of the effective inductance in the overall resonator circuit, which, in this case, includes inductors 32e, 32ee and 32c. The resonator circuit thus comprises the loop 38 formed by capacitors 31a and 31b of on-chip resonator portion 31; inductors 32e and 32ee, blocking capacitor 36d (which has essentially no effect) and varactor 36d of off-chip resonator portion 35; and the series parasitic ground inductance 32c, which closes the loop of the resonator circuit. (Note that inductor 32c represents the effective series inductance between the off-chip ground node 33c and the on-chip ground node 37. Where, as is frequently done, multiple pins are used to connect the off-chip and on-chip grounds, the effective inductance 32c will be reduced. In the preferred embodiment, in which ten pins connect to the off-chip ground, this effective inductance 32c is approximately 0.1 nH.)

As the resonator resonates at the LO frequency, the peak transient current flowing in the resonator loop 38 can reach 100 mA. Assuming an effective series ground inductance 32c of 0.1 nH and an LO frequency of 2 GHz, the transient current through inductor 32c induces a computed (i.e. $2\pi f_{LO} L_{eff} I_{peak}$) bounce in the on-chip ground voltage of more than 1 Volt! With this level of LO noise in the on-chip ground, there is no practical way to design an RF input amplifier 11 with a power supply rejection ratio (PSRR) sufficiently high to avoid significant LO leakage at the RF input terminal 10. Armed with this detailed recognition of the problem, one can now fully appreciate the inventors' solution thereof.

Reference is now made to FIG. 4, which schematically depicts the coupling of off-chip and on-chip resonator portions in accordance with the invention. (Where detail has been omitted in FIG. 4, it should be assumed to be identical to the corresponding section of FIG. 3). In FIG. 4, off-chip resonator portion 35 is connected to on-chip resonator portion via so-called floating resonator coupling pins 43a–b. A floating pin is a pin that is not connected, off-chip, directly to a low impedance DC source or ground node. Accordingly, a floating pin connects to an off-chip node at which the impedance conditions are such that the voltage is relatively free to float or vary. By contrast, pin 39 (FIG. 3 and 4) is clearly not floating pins since it connects directly to the off-chip ground node 330.

Connecting the off-chip and on-chip resonator portions, 35 and 31, via a plurality of floating pins in accordance with the invention minimizes the inductive coupling of LO frequency noise which increases LO leakage. Referring to FIG. 4, resonator coupling pin 43b, a floating pin having a parasitic series inductance 42, conducts a large resonator transient current 11. Like with inductor 32c in the conventional circuit of FIG. 3, the transient current in inductor 42 induces an LO frequency transient voltage across inductor 42 of approximately 1 Volt. However, since inductor 42 (i.e., pin 43b) is directly connected to an off-chip node 46 which is free to float, it is largely node 46, rather than the on-chip ground node 37, which absorbs the LO frequency voltage swing induced by inductor 42. Thus, the LO frequency noise in the on-chip ground is greatly reduced, and so is the LO leakage. Comparing the circuits of FIGS. 3 and 4, the LO leakage at certain frequencies is reduced as much as 28 dBm—and with no added cost Another way of appreciating the invention is to look at resonator coupling pins—i.e., those pins used exclusively to couple signals between the off-chip and on-chip portions of the resonator, for example, pin 43a in FIG. 3 and pins 43a–b in FIG. 4. In circuits constructed in accordance with the present invention, the net current leaving the integrated circuit package 200 via the resonator coupling pins will be approximately zero. Looking at the conventional circuit of FIG. 3, it is clear that the net current leaving package 200 via the sole resonator coupling pin 43a is not approximately zero. Indeed, it is approximately 100 mA.

By contrast, in the preferred embodiment of the invention depicted in FIG. 4, the net current exiting package 200 via the two resonator coupling pins 43a–b is approximately zero since, at all times, these pins conduct approximately equal but opposite currents, 11 and 12a respectively. Of course, the invention is not limited to circuits using two resonator coupling pins. Nonetheless, embodiments of the invention utilizing more than two resonator coupling pins still exhibit the property that the net current leaving the integrated circuit package via the resonator coupling pins is approximately zero.

Still another way of viewing the invention depicted in FIG. 4 is to look at the transient current cancellation which takes place at the current summing point 37b. Summing point 37b combines the +90° transient current 12 with the −90° transient current 11. The effective cancellation of resonator transient currents at point 37b largely eliminates such LO frequency transient signals in other portions of the on-chip ground node 37.

FIGS. 5A–E depict the board layouts for several receivers, specifically showing the coupling between the off-chip varactor portion 35 and the pins of the receiver chip 200. For reference in appreciating FIGS. 5A–F, the pinouts for chip package 200 are as follows:

| Pin # | Signal |
|---|---|
| 251a | GND |
| 251b | GND |
| 251c | RF Input |
| 252a | GND |
| 251d | Vdd |
| 251e | IF Output |
| 251f | GND |
| 251g | GND |
| 251h | GND |
| 251i | LO (i.e., external resonator) |
| 252b | GND |
| 251j | OSC |
| 251k | Vdd |
| 251l | GND |

Chip package 200 is mounted to each of the boards 500a–e in the same position. Illustratively, consider board 500a of FIG. 5A. Package 200 is oriented such that the Vdd pins, 251d and 251f, contact metalization 501. In this orientation, the dual lines of pins run vertically, with pin 251f, located in the upper left corner of package 200, contacting off-chip ground through metalization 502. Pin 251l also contacts off-chip ground via metalization 502. IF output pin 251e bonds to metalization 503a and a DC blocking capacitor mounts between metalizations 503a and 503b. The external oscillator output from pin 251j, which can be used to drive an external PLL, bonds to metalization 504. A large ground metalization 505 contacts the remaining ground pins, 252a–b, 251a–b and 251g–h. RF input from pin 251c bonds to metalization 506.

Figure 5A:
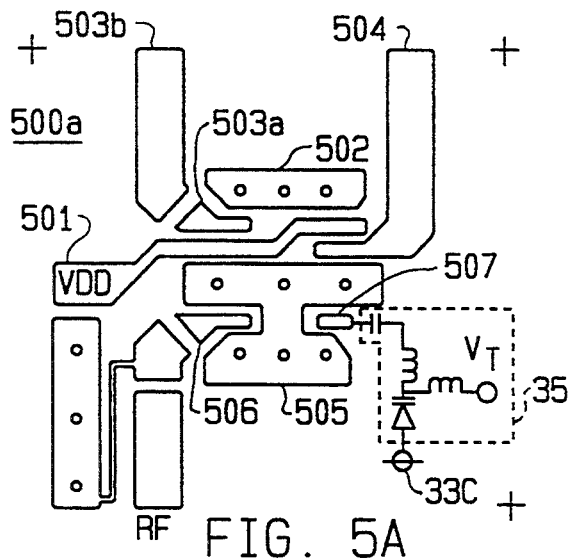
FIGS. 5A through 5E depict board layouts showing the coupling of the off-chip resonator portions to the chips; and, FIG. 6 shows plots of the LO leakage as a function of frequency for the board layouts shown in FIGS. 5A through 5E.

Still considering FIG. 5A, off-chip resonator portion 35 connects to a single resonator coupling pin 251i via metalization 507. The other terminal from off-chip resonator portion 35 connects to the off-chip system ground 33c. Thus, FIG. 5A shows the conventional resonator coupling depicted schematically in FIG. 3.

Figure 5B:
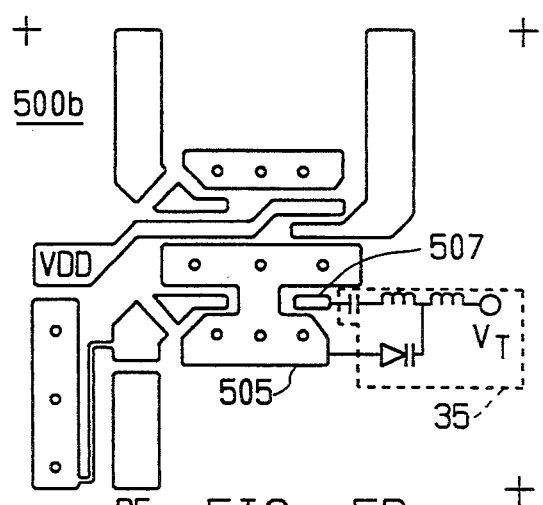
Figure 5C:
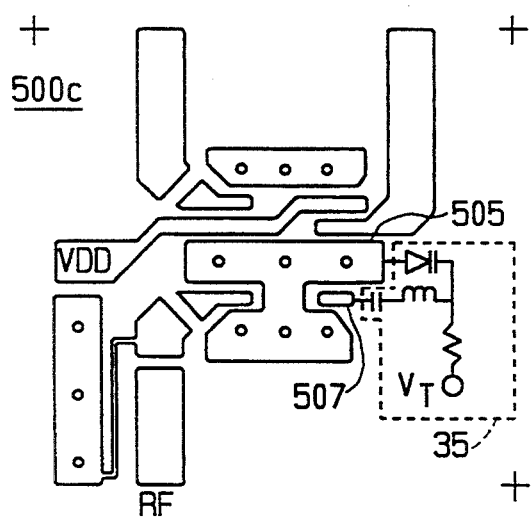

FIG. 5B shows a modification of 5A in which the grounded end of the off-chip resonator portion 35 is connected to the large ground metalization 505 at a point physically close to the resonator coupling pin connection. FIG. 5C shows a similar modification in which the grounded terminal of off-chip resonator portion 35 connects to ground metalization 505 at a different location.

Figure 5D:
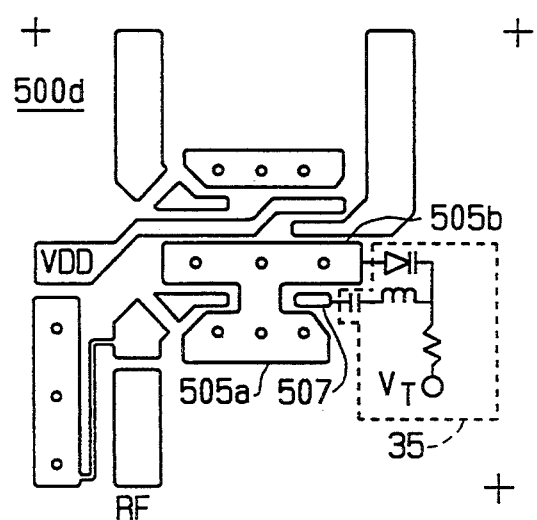
Figure 5E:
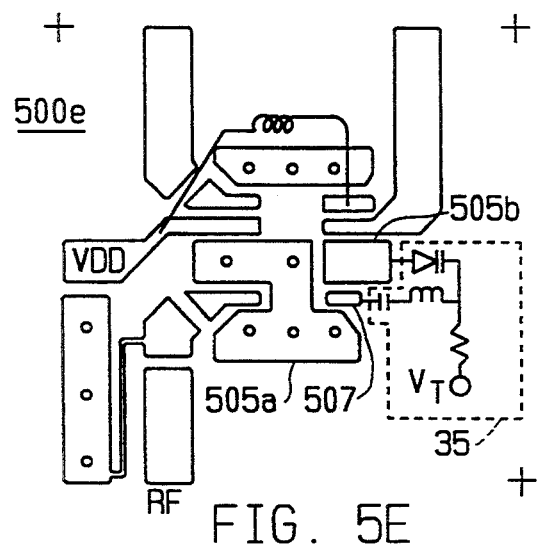

FIGS. 5D and 5E depict off-chip resonator couplings in accordance with the invention. In FIGS. 5D–E, ground metalization 505 has been partitioned into two separate pieces, 505a and 505b. Metalization 505a couples off-chip ground to five of the six ground pins previously connected to metalization 505. The separated piece, 505b, connects to pin 252b, which is now being used as a floating, resonator coupling pin. In FIG. 5E, a 75 nH inductor 520 is connected between the two Vdd pins in order to provide additional isolation of high-frequency transient signals.

Figure 6:
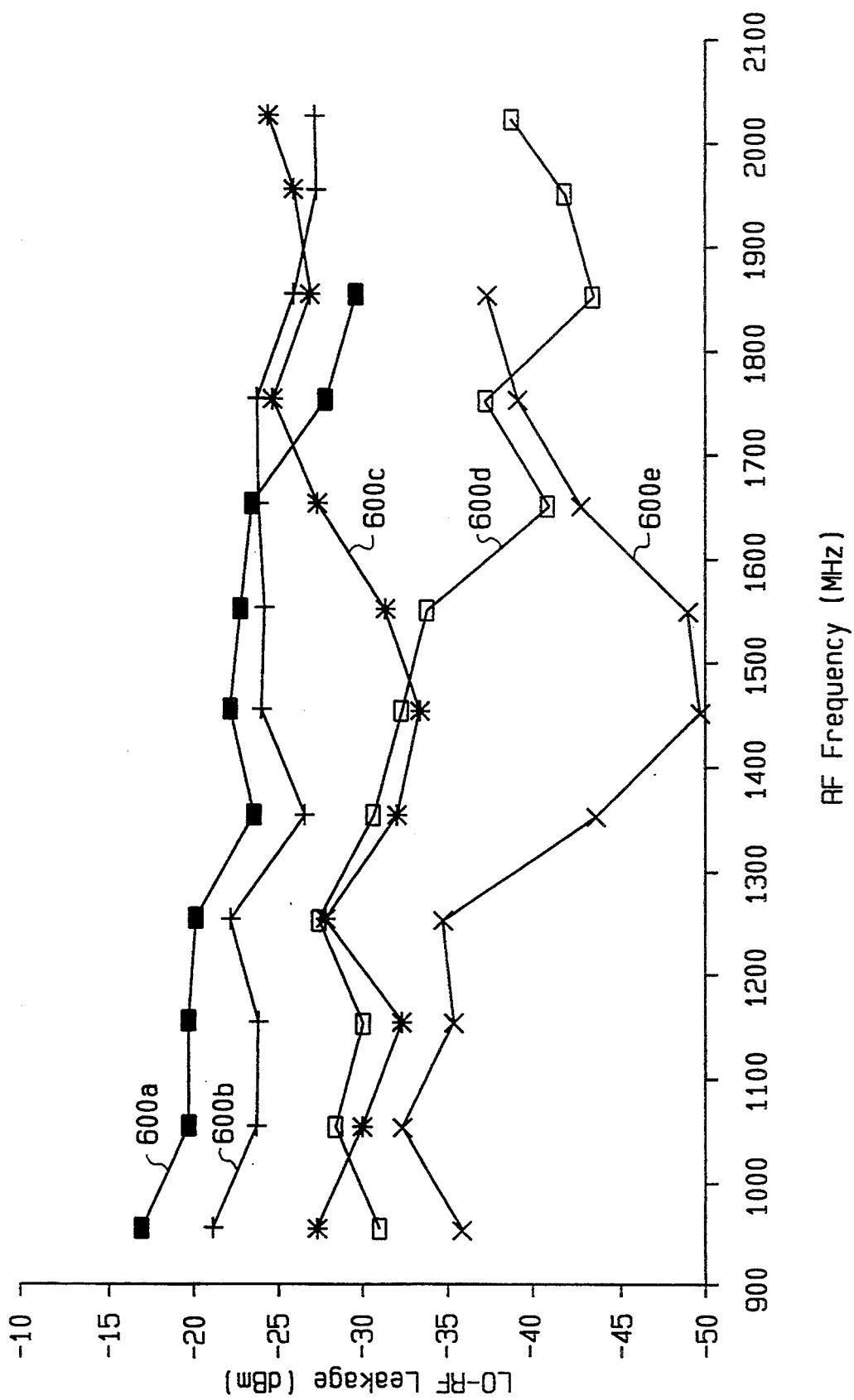

FIG. 6 shows comparative plots of the LO leakage as a function of frequency for the board layouts depicted in FIGS. 5A–E. Traces 600a–c show the LO leakage for boards 500a–c, respectively. The preferred embodiments of the invention, boards 500d and 500e, are shown as traces 600d and 600e, respectively. The substantial improvement in LO leakage realized by the invention is clearly evident. This improvement is particularly pronounced at the higher LO frequencies.

Those skilled in the art will recognize that the preferred embodiments described hereinabove reflect but a few of the many uses of the present invention. Therefore, the scope of the present invention shall be limited only by the following claims and equivalents thereto.

What is claimed is:

1. A frequency conversion device comprising:
   a resonator circuit;
   an oscillator circuit coupled to said resonator circuit for generating an LO signal;
   a mixer circuit for receiving an RF signal from an RF input node and said LO signal from said oscillator circuit and for generating an IF signal by mixing said RF and LO signals;
   a package encapsulating therein at least a part of said mixer circuit and a part of said oscillator circuit, said package having a plurality of pins electrically coupled to said at least parts of said mixer and oscillator circuits encapsulated therein,
   wherein at least a portion of said resonator circuit is located outside said package, said outside portion of said resonator circuit connecting to at least two external resonator pins of said package Such that, during the operation of the frequency conversion device, a net current entering the package via said external resonator pins is approximately zero.

2. A frequency conversion device comprising:
   a resonator circuit;
   an oscillator circuit coupled to said resonator circuit for generating an LO signal;
   a mixer circuit for receiving an RF signal from an RF input node and said LO signal from said oscillator circuit and for generating an IF signal by mixing said RF and LO signals;
   a package encapsulating therein at least a part of said mixer circuit and a part of said oscillator circuit, said package having a plurality of pins electrically coupled to said at least parts of said mixer and oscillator circuits encapsulated therein,
   wherein at least a portion of said resonator circuit is located outside said package, said outside portion of said resonator circuit being connected to said package via a plurality of floating pins, said floating pins being pins not used to couple DC power or ground to said package.

3. A frequency conversion device as defined in claim 2 wherein a net current entering the package via said plurality of floating pins is approximately zero.

4. A frequency conversion device as defined in claim 2 wherein a net current entering the package via certain ones of said plurality of floating pins is approximately equal to a net current leaving remaining ones of said plurality of floating pins.

5. A method of reducing local oscillator leakage in an integrated circuit frequency conversion device comprising the steps of:
   (a) coupling an RF signal to an input pin of the integrated circuit frequency conversion device;
   (b) providing DC voltage to at least one DC power pin of the integrated circuit frequency conversion device;
   (c) providing ground voltage to at least one ground pin of the integrated circuit frequency conversion device;
   (d) coupling at least a portion of a resonator circuit to said integrated circuit frequency conversion device, said coupling of the resonator portion not using any of said DC power pins or ground pins.

6. The method of claim 5 wherein step (d) couples said resonator portion to first and second pins of said integrated circuit frequency conversion device such that the current entering the first pin is substantially equivalent to the current leaving the second pin.

7. The method of claim 5 wherein step (d) couples said resonator portion to via a plurality of resonator coupling pins such that the a net current flowing into said integrated circuit frequency conversion device via said resonator coupling pins is approximately zero.

8. An electronic system comprising:
   a package having a plurality of electrically conducting pins and encapsulating therein a plurality of electronic components, including an on-chip portion of a resonator circuit;
   an off-chip resonator portion located outside said package, said off-chip resonator portion forming, in combination with said on-chip resonator portion, said resonant circuit,
   wherein said off-chip and on-chip resonator portions are connected via a plurality of floating pins, said floating pins being pins not used to couple DC power or ground to said package.

9. An electronic system comprising:
   a package having a plurality of electrically conducting pins, said package encapsulating therein a plurality of electronic components, including an on-chip portion of a resonator circuit;
   an off-chip resonator portion located outside said package, said off-chip resonator portion forming, in combination with said on-chip resonator portion, said resonant circuit,
   wherein said off-chip and on-chip resonator portions are connected via a plurality of resonator coupling pins, such that a net current leaving said package via said resonator coupling pins is approximately zero.

* * * * *